(12) United States Patent
Balamurugan et al.

(10) Patent No.: US 6,216,055 B1
(45) Date of Patent: Apr. 10, 2001

(54) PARTIAL SEMICONDUCTOR WAFER PROCESSING

(75) Inventors: Subramanian Balamurugan; Chie-Keong Wong, both of Singapore (SG); Russell A. Kent, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/188,989

(22) Filed: Nov. 9, 1998

Related U.S. Application Data (60) Provisional application No. 60/069,774, filed on Dec. 16, 1997.

(51) Int. Cl.[7] .......................... G06F 19/00; H01L 21/301
(52) U.S. Cl. ............................................. 700/121; 438/462
(58) Field of Search .................................... 700/121, 125, 700/114, 116; 438/33, 462; 430/311; 356/237.4, 237.5; 382/151

(56) References Cited

U.S. PATENT DOCUMENTS

| | | | |
|---|---|---|---|
| 4,778,745 | * | 3/1987 | Leung .................................. 430/311 |
| 5,428,442 | * | 9/1993 | Lin et al. .......................... 356/237.5 |
| 5,838,951 | * | 8/1996 | Song ...................................... 716/19 |
| 5,851,848 | * | 6/1996 | Balamurugan ........................ 438/33 |
| 5,943,551 | * | 9/1997 | Schemmel et al. .................... 438/14 |
| 6,016,358 | * | 2/1998 | Balamurugan ....................... 382/151 |
| 6,028,664 | * | 4/1997 | Cheng et al. ..................... 356/237.4 |

* cited by examiner

Primary Examiner—William Grant
Assistant Examiner—Ronald D Hartman, Jr.
(74) Attorney, Agent, or Firm—Robert L. Troike; Frederick J. Telecky, Jr.

(57) ABSTRACT

Partial wafer processing is achieved by down loading the wafer map of the whole wafer from a host (2) and if the partial wafer (half or quarter) contains the reference die (4) move table to a locator die (5) and upload locator die coordinates to wafer map data host (6) and remove other half or quadrants die coordinates from the map (10). If the partial wafer is not in the first half or first quadrant position wafertable to auxiliary reference die, find out which half or quadrant partial wafer belongs (8) and compute auxiliary reference die coordinates from locator die coordinates (9) and then using auxiliary die coordinates as information remove other quadrant or half die coordinates from the map (10).

5 Claims, 13 Drawing Sheets

PARTIAL SEMICONDUCTOR WAFER PROCESSING

This application claims priority under 35 USC §119(e)(1) of provisional application No. 60/069,774, filed Dec. 16, 1997.

TECHNICAL FIELD OF THE INVENTION

This invention relates to semiconductor wafer processing and more particularly to partial wafer processing in die bonders for wafermap operations.

RELATED CO-PENDING APPLICATION

This invention is relates to Application Ser. No. 08/667,246 filed Jun. 20, 1996 entitled, "Method and Apparatus for Aligning the Position of Die on a Wafer Table," of Balamurugan. The application is incorporated herein by reference.

BACKGROUND OF THE INVENTION

Semiconductor manufacturing includes the process of die attached performed by a die bonder or die attach machine. The basic operation of die bonder is to mount dies on lead frames. The die bonder deposits epoxy on the lead frame pad, picks up a die, and places it on the lead frame die pad. The epoxy is a historic term and is actually an adhesive which uses no catalyst.

The die is picked up by suction. The good dies are individually picked up and placed on a lead frame. To do this the location of the die must be precisely known so the machine can pick up the die.

The silicon wafer provides several patterns, to form a plurality of semi-conductor circuits. The individual integrated circuits on the wafer are separated by horizontal and vertical thoroughfares. The thoroughfares are border spaces between the semiconductor devices on the wafers. Along these thoroughfares are formed the saw streets when a cutter passes through them separating the individual circuits into what is termed "dies". This process is referred to as sawing. Before cutting the separate circuits, the back of the wafer is placed on a double backed tape which in turn is stretched like a drum over a ring base called flexframe on a controllable wafer table. The location of the dies on the original wafer is recorded on the wafer map stored in a memory. After sawing the wafer, the dies are moved. Hence moving the wafer table per the wafer map coordinates does not accurately position the wafer table for the next die to be picked. Small die wafer map operation on die bonder equipment is not feasible because of this. The variation in the saw street width across the wafer coupled with the tape shrinkage on partially picked wafers makes the one time correction of table jump distance for street width variation ineffective in ensuring the accurate table position.

A full wafer has one reference die. Sometimes it is desirable to only use part of a wafer for a particular job and store away the remaining for later use. The partial use will usually result in removal of the reference die. Therefore a reference die may not be available.

SUMMARY OF THE INVENTION

In accordance with one embodiment of the present invention coordinates for a locator die and/or an auxiliary reference die are stored on a wafer map of a given wafer for locating dies on a partial section of the given wafer.

These and other features of the invention that will be apparent to those skilled in the art from the following detailed description of the invention, taken together with the accompanying drawings.

DETAILED DESCRIPTION OF THE INVENTION

Figure 1:
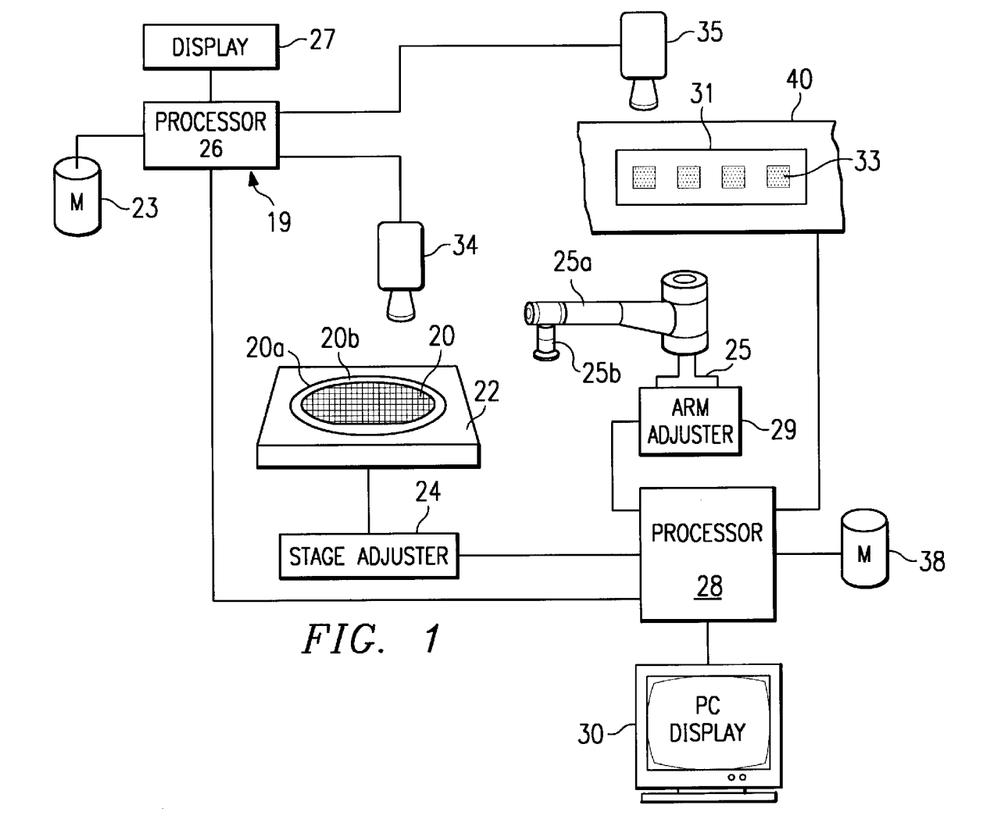
FIG. 1 is a diagram of the system according to one embodiment of the present invention.

Referring to FIG. 1, there is illustrated a schematic representation of an alignment system using a die bonder (die mounter or die attach) that may be used in the fabrication process of integrated circuits on silicon wafers according to the present invention. The die bonder may be, for example, Abacus IIID-SA Die Bonder of Texas Instruments Incorporated. A die bonder dispenses epoxy on a die pad of a lead frame and mounts the die to the pad. A silicon wafer 20 is carried by a table 22 which is moveable in conjunction with a table adjuster 24, which is coupled to table 22. A robot 25 of the system, including a controllable arm 25a and suction end effector 25b, picks up the die and places the die on pad 33 of lead frame 31 by arm adjuster 29. The robot 25 is controlled by processor 28. The lead frame handling system 40 moves and positions the lead frame to allow placement of the die. The lead frame handling system 40 also applies the epoxy to the pad 33 of lead frame 31 before the die is placed on the lead frame 31. The wafer table 22 via the adjuster 24 moves the wafer 20 to locate the next die under program control of processor 28 so that robot arm 25a picks up the die from wafer 20 and places it on pad 33 of lead frame 31. After the table 22 is moved to one good die the align system 19 takes over for good alignment initiated by processor 28. The align system 19 consists of a processor 26, display 27, storage device 23, camera 34, and camera 35. The align system 19 provides an align correction signal to align a die accurately and is coupled to processor 28. During the alignment process, an output signal is produced by processor 26 and, the output signal may be delivered to the table adjuster 24 through processor 28 so as to reposition the wafer table in response to an output signal. The substance of the output signal may also be displayed by the processor 26 on the display 27. In order to perform the alignment or misregistration check, processor 26 receives a video image from a video camera 34 (such as a CCD camera) which is a subsystem of the alignment system. The camera includes the optics to focus on the wafer or lead frame. The video signal is digitized using, for example, a video to digital converter as part of the camera. Whenever an alignment is made, the processor 26 takes a picture via the camera 34 and looks for a pre-taught (stored) pattern. In one embodiment a unique pattern is in the die and is stored and when an alignment call is made the align system takes a picture and looks for that pattern. In another embodiment the align system takes a picture and aligns to the four sides (streets) of the die. The pattern of the integrated circuit is taught or stored in a memory of the processor 26 or memory or storage 23 at the time the device is setup. The processor 26 calculates the displacement of the stored pattern (alignment point) to current pattern and provides a correction signal. This displacement in x and y direction is the x and y correction. This correction signal dependent on the correction value through processor 28 is sent to the wafer table adjuster 24 from processor 26 for accurately positioning of the table so the die is picked up. If the displacement is too great so the stored pattern to current pattern is too great the align system 19 will not be able to do the alignment. It is therefore very important that before alignment is done, the wafer table 22 is moved close to the alignment point. The precise location of the lead frame 31 may be determined by align system 19 using a second camera 35 (such as a CCD video camera)also coupled to the processor 26. The wafer map identifying the locations of the dies and which dies are good or bad are stored in the wafer map in storage 38. When bad dies have been identified they are marked and the information is stored in the storage 38 so that the system coupled to the storage knows the bad dies and skips or jumps these bad dies. The align system 19 gives the correct distance to the wafer table adjuster 24 to move the table 22 if not aligned sufficiently for the pickup device to pick up the die. The robot arm 25a picks up the properly aligned die and places it on the pad of the lead frame. The lead frame handling system 40 then moves the next lead frame pad into position. The present application is particularly directed to the step of accurately moving the wafer table to every good die on the wafer so that the align system 19 can align the die properly and enable the robot arm 25 to pick up the good dies.

Figure 2A:
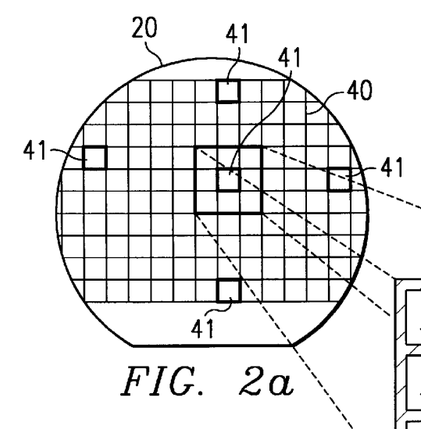
FIGS. 2a–2b illustrates a prior art wafer and thoroughfares on a wafer.
Figure 2B:
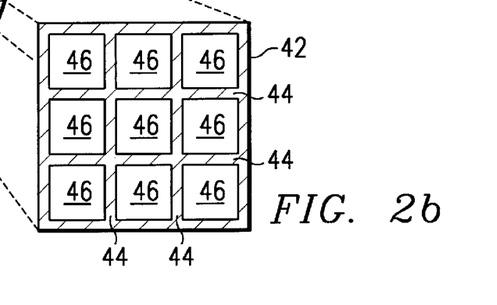

Referring to FIG. 2a there is shown silicon wafer 20 with a reducible layout 40 shown there on. An exploded section 42 shown in FIG. 2b shows four scribe line segments 44 defining chips 46. Although the pattern formed by the described segments shown in exploded section are uniform, it is to be understood that an exploded view on most all wafers would contain unique line segments. The line segments 44 are thoroughfares extending to both horizontal and vertical directions separating the separate integrated circuits or chips 41. The wafers before being cut are stuck on a double-backed tape 20b and the tape 20b is stretched over a support ring 20a as illustrated in FIG. 1. As the cutter passes through the thoroughfares 44 the saw streets are formed which separates the individual die pieces or chips. After the cutting of the wafer, the variation in saw street width coupled with the tape shrinkage due to pulling on the tape, the wafer table jump may not be accurate. This is particularly true for large jumps between good dies. The saw street width vary across the wafer in both axes due to uneven wafer mount tape expansion, saw blade variations, etc. There is also a change in distance between the dies, due to shrinkage of the tape on which the wafer is mounted, as the dies are picked off the wafer. After the sawing or cutting has occurred, the align system 19 and the processor 28 compute the average saw street width in both the horizontal and vertical axes.

Figure 3:
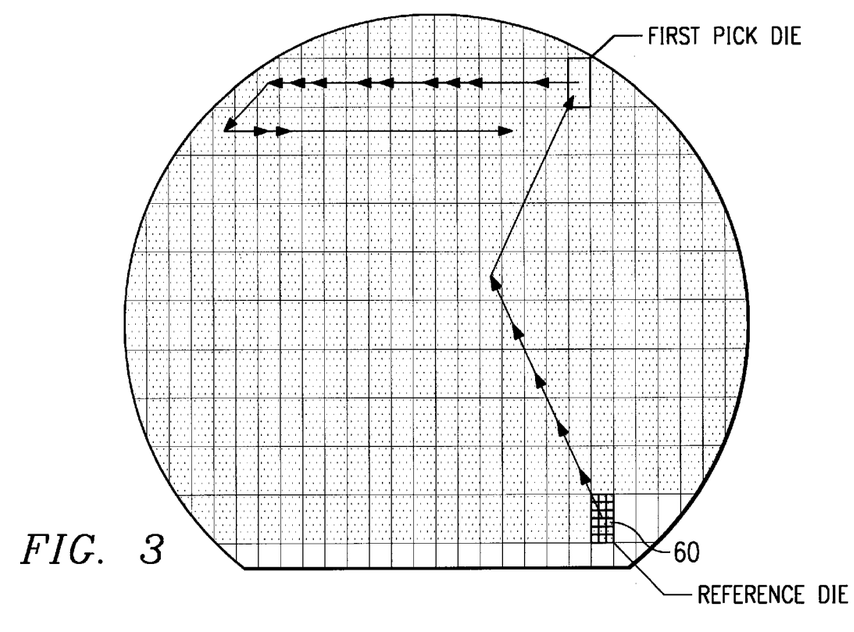
FIG. 3 illustrates a prior art wafer with a reference index.

The present invention modifies the current system to allow for partial wafers. As illustrated in FIG. 3, a traditional wafer map system uses a single fixed reference point. This reference die may be identified by the right most fully patterned die in the first row next to the blanks. FIG. 3a illustrates wafer map coordinates. If the wafer is separated, then all pieces (partial) except one will be without reference points, making wafer map processing impossible. The present invention provides auxiliary reference dies for each partial (quadrant or half) wafer and enables processing of partial wafers using wafermapping.

Figure 4:
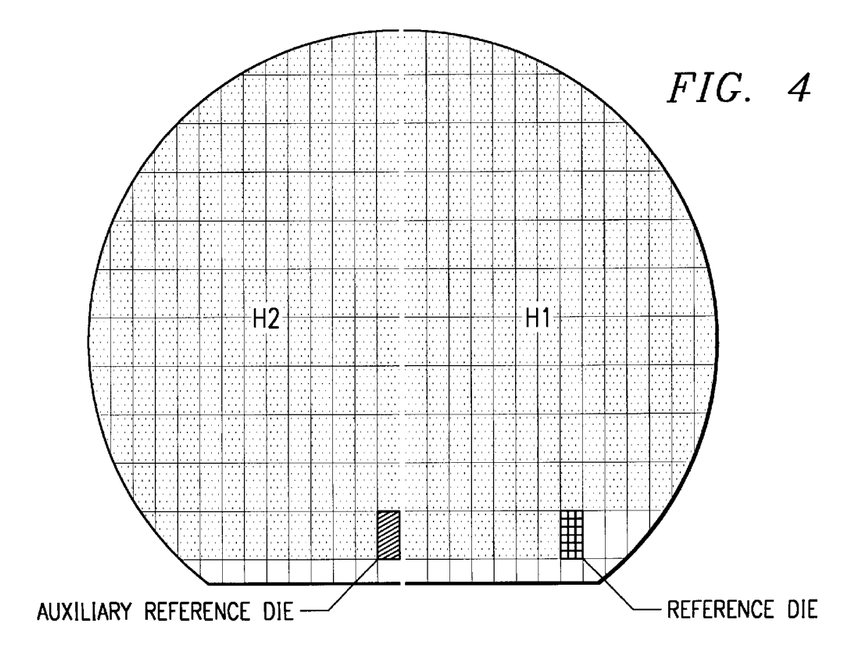
FIG. 4 illustrates a half wafer with reference die and auxiliary reference die according to one embodiment of the present invention.
Figure 5:
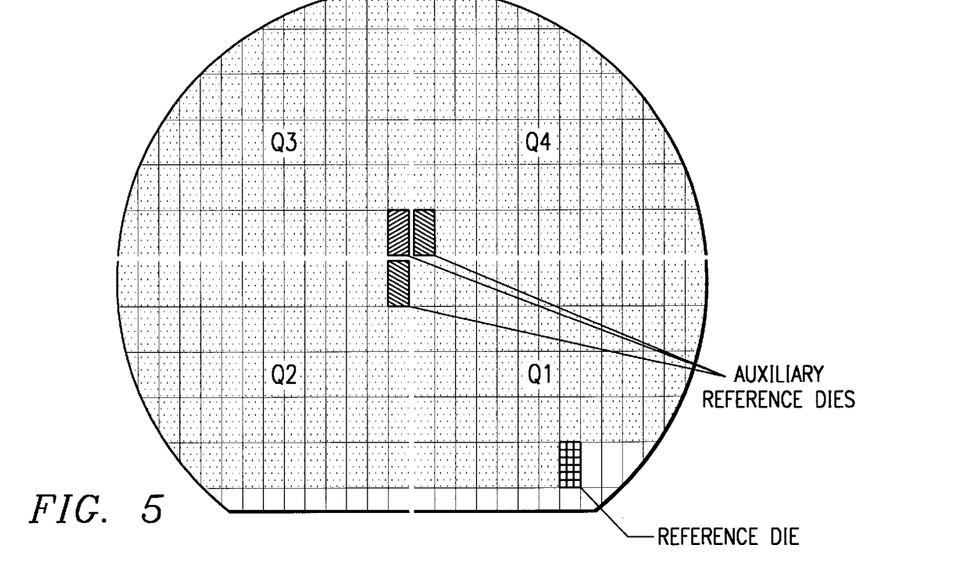
FIG. 5 illustrates reference die and auxiliary reference die for quarter wafer processing.

Referring to FIG. 4 there is illustrated two half wafers H1 and H2. The reference die is located in the first half H1 and an auxiliary reference die is located in the second half H2 in the lower right corner of H2 on the same row as the reference die. The auxiliary reference dies for quarter wafer processing are located as illustrated in FIG. 5 at the corners of the intersections of the four quadrant dies. For quadrant Q1, there is only the reference die.

Figure 6:
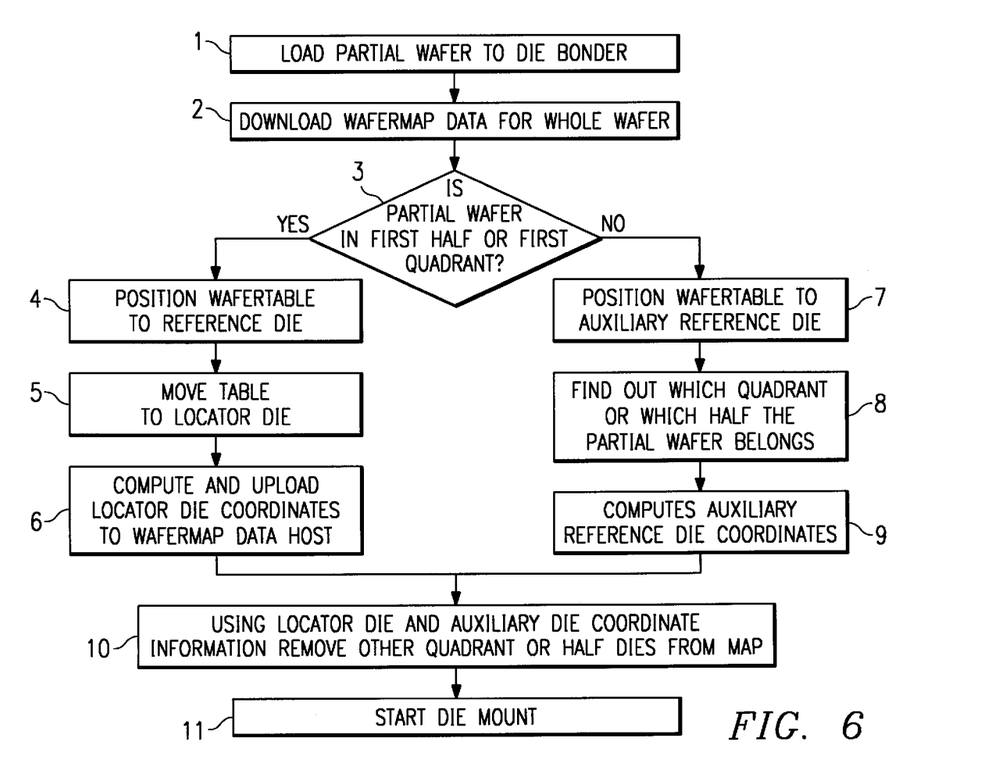
FIG. 6 is a flow chart for partial wafer processing.
Figure 7:
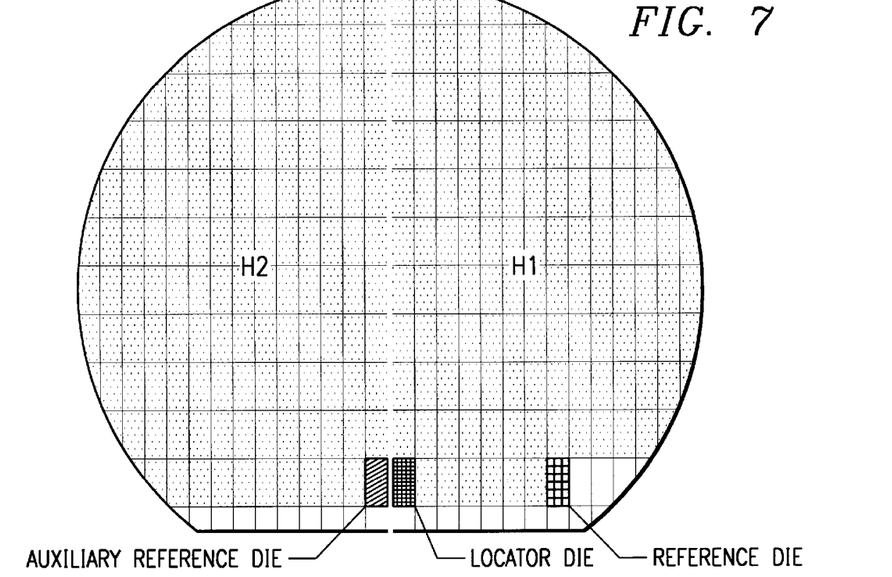
FIG. 7 illustrates reference die, auxiliary reference die and locator die for half wafer processing.
Figure 8:
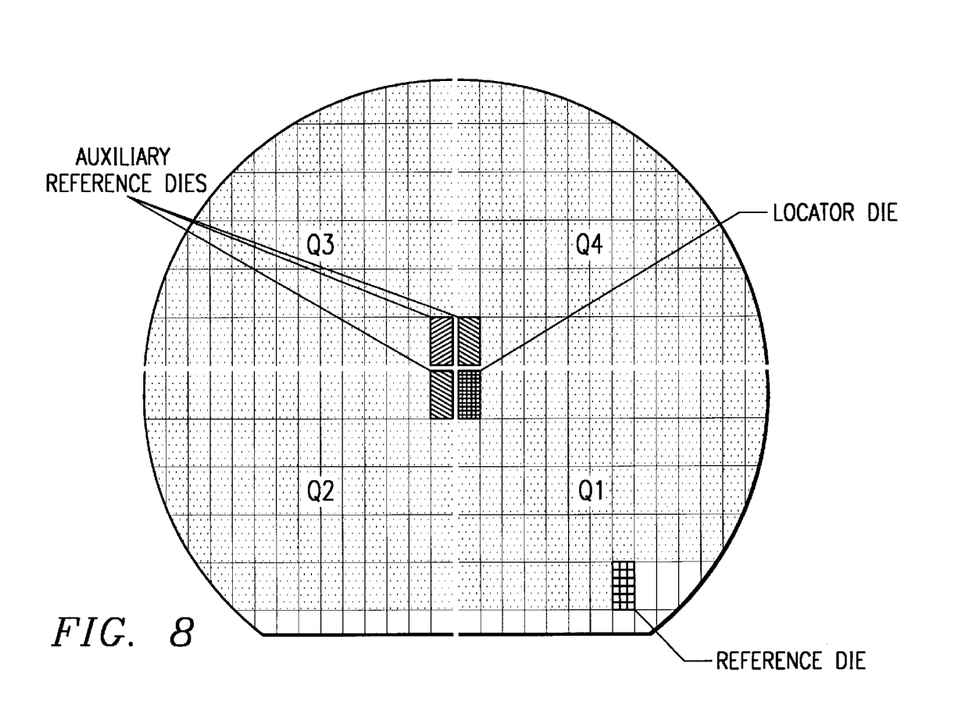
FIG. 8 illustrates reference die, auxiliary reference dies and locator die for quarter wafer processing.

Referring the FIG. 6, there is illustrated a flow chart for the processor in FIG. 1 for partial wafer processing. FIG. 7 illustrates the reference die, auxiliary reference die and locator die for half wafer processing. FIG. 8 illustrates reference die, auxiliary reference dies and locator die for quarter wafer processing.

It is a requirement that the first half or quadrant with the reference die be processed in the die bonder before the rest are processed. Normally Q1 and H1 (see FIG. 4 or 5) is processed first.

The following steps are based on the zero degree of wafer rotation angle. The same steps are also used for different rotation angles.

Step 1: Load partial (half or quadrant) wafer into Die Bonder (after Saw).

Step 2: Download wafermap data for the whole wafer from wafermap data host.

Step 3: If the partial wafer loaded is not first half (H1) or first quadrant (Q1) then go to step 7.

Step 4: Position wafer table to reference die.

Figure 9:
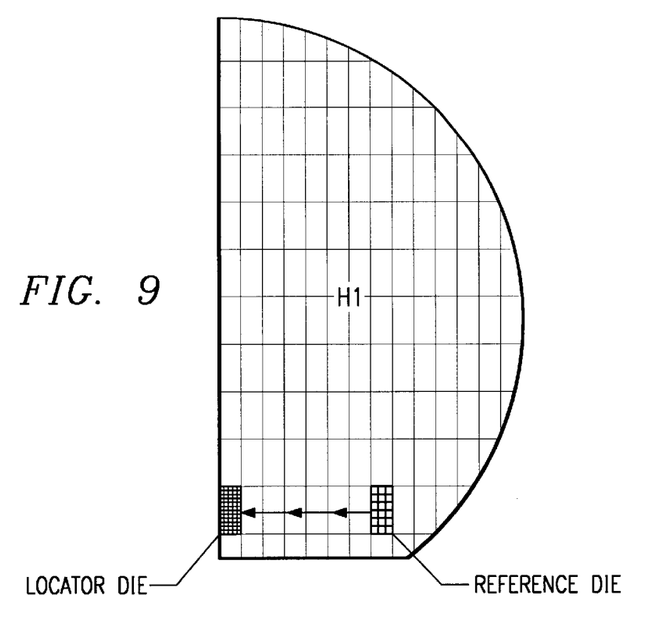
FIG. 9 illustrates moving wafer table to locator die for half wafer processing.
Figure 9A:
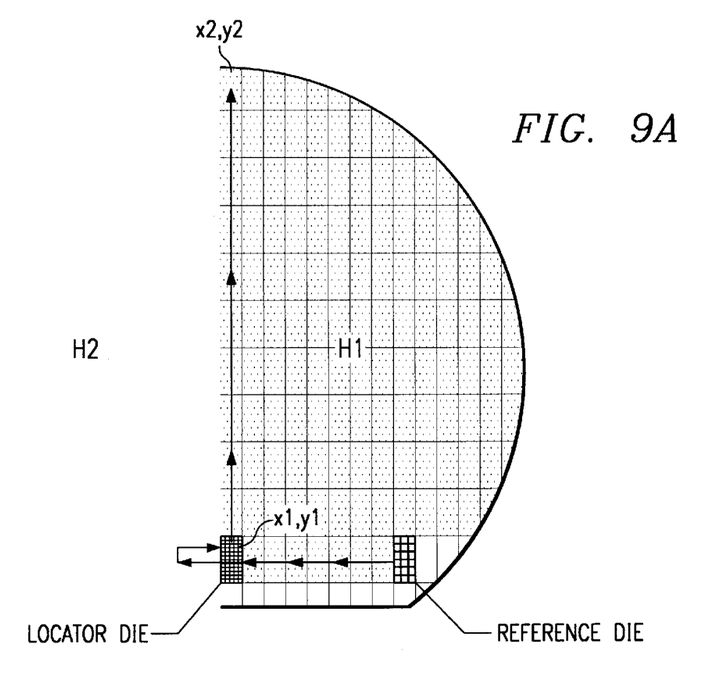
FIG. 9a illustrates moving wafer table to locator die for half wafer processing in automatic mode.
Figure 10:
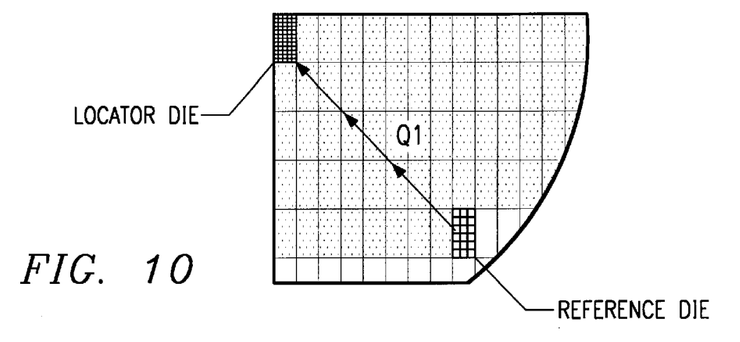
FIG. 10 illustrates moving wafer table to locator die in quadrant 1 for quarter wafer processing.
Figure 10A:
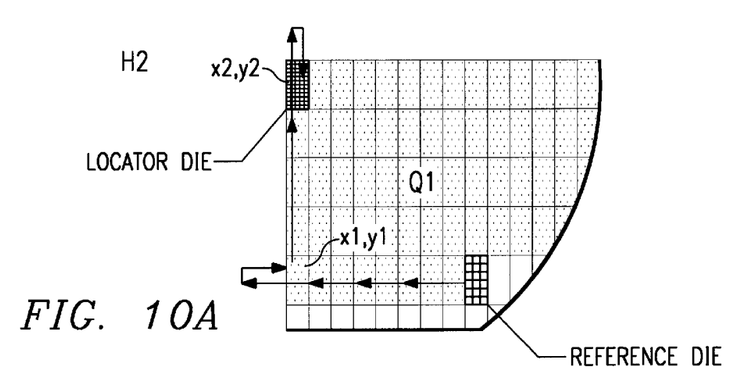
FIG. 10a illustrates moving wafer table to locator die for quarter wafer processing in automatic mode.

Step 5: Move the table to the locator die by automatic or manual means. See FIGS. 9 and 10. For half wafer move wafer table from reference die along the same row to the left to locator die. This is the last die in the row of the partial wafer. For quarter wafer processing in the manual mode move along the diagonal towards upper left corner. For the automatic mode move the table from the reference die along the same row as the reference die to the left noting coordinates one die at a time to the end of the partial wafer. The table is then moved up the column as shown in FIG. 9a and 10a until it reaches the end of the wafer. If the coordinate ($x2$, $y2$) of FIG. 9a which is at the top of the whole wafer then it is a half wafer and the locator die is ($x1$, $y1$). If the coordinate ($x2$,$y2$) is below the top coordinate of a whole wafer in the same column then it is a quarter and then locator die coordinate is ($x2$, $y2$) as shown in FIG. 10a.

Step 6: Compute and upload the locator die coordinates to wafermap data host. Go to step 10.

Step 7: Position the wafer table to auxiliary reference die.

Step 8: Find out which quadrant of wafer or which half of wafer.

The following method is used to find out which quadrant or half the partial wafer belongs to.

Figure 11:
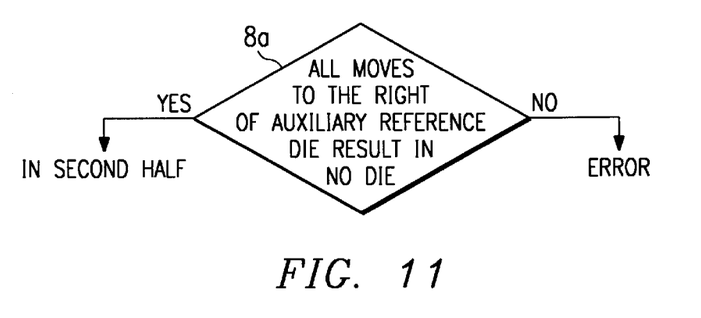
FIG. 11 illustrates step to determine if in second half of wafer.
Figure 12:
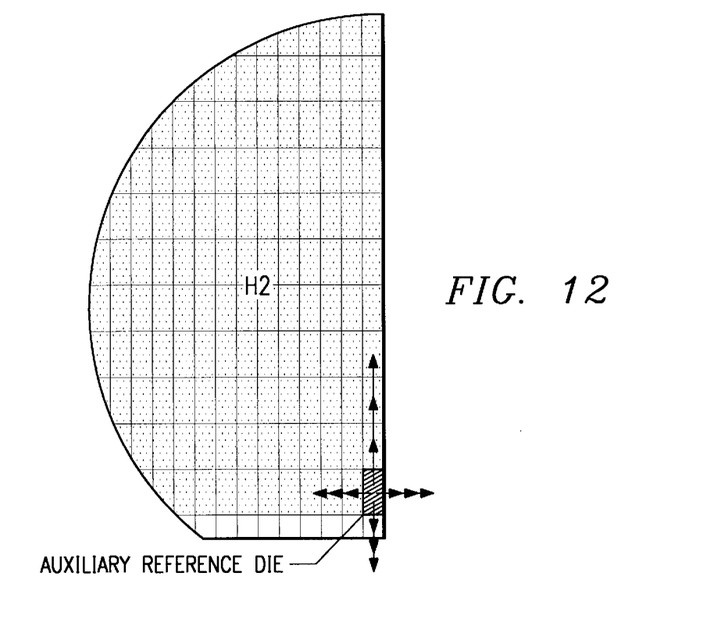
FIG. 12 illustrates confirming auxiliary reference die position in half wafer processing.

For second half of wafer (H2) the following step 8a of FIG. 11 are true:
a. Auxiliary reference die row is same as reference die row.
b. From auxiliary reference die position, if wafer table is moved in four directions (left, right, up, down) for a certain minimum number of times, all moves in. the right direction of auxiliary reference die should not see any die. See FIG. 12.

Figure 13:
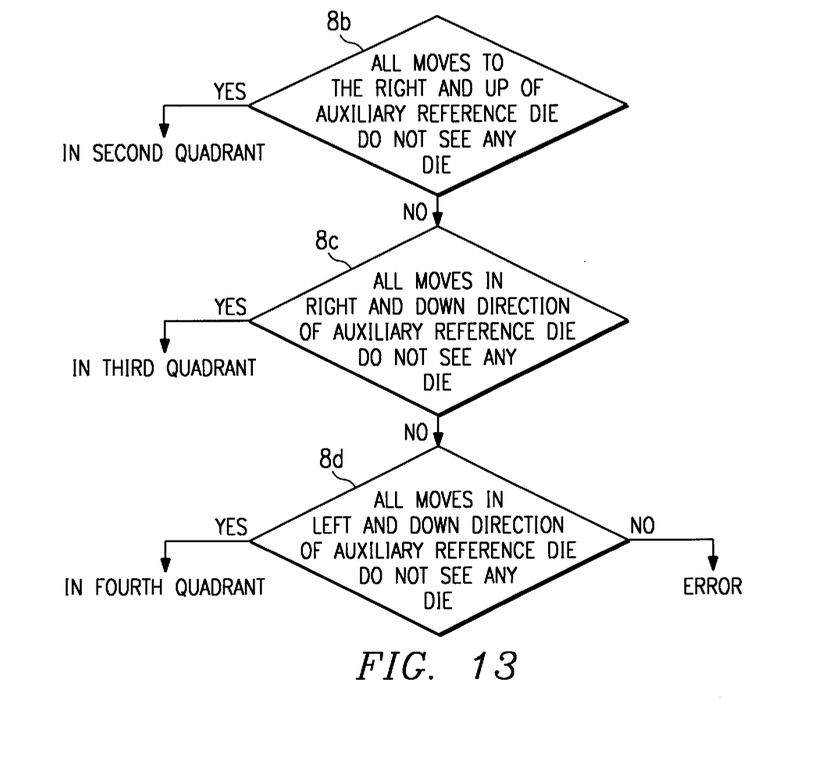
FIG. 13 is a flow chart to determine quadrants 2, 3, or 4.

The flow chart of FIG. 13 is to determine which other quadrant than Quadrant 1.

Figure 14:
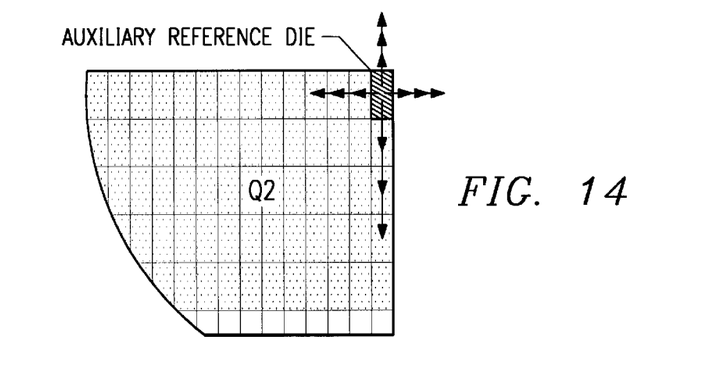
FIG. 14 illustrates method of finding quadrant 2 in quarter wafer processing for quadrant 2.

For second quadrant of wafer (Q2) the following are true:
a. From auxiliary reference die position, if wafer table is moved in four directions Deft, right, up, down) for a certain minimum number of times, all moves in the right & up direction of auxiliary reference die should not see any die. See step 8b of FIGS. 13 and 14.

Figure 15:
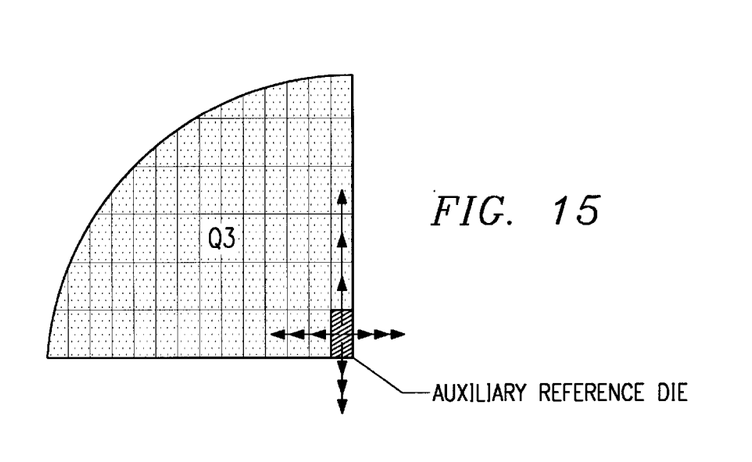
FIG. 15 illustrates method of finding quadrant 3 in quarter wafer processing.

For third quadrant of wafer (Q3) the following are true:
a. From auxiliary reference die position, if wafer table is moved in four directions (left, right, up, down) for a certain minimum number of times, all moves in the right & down direction of auxiliary reference die should not see any die. See step 8c and FIG. 15.

Figure 16:
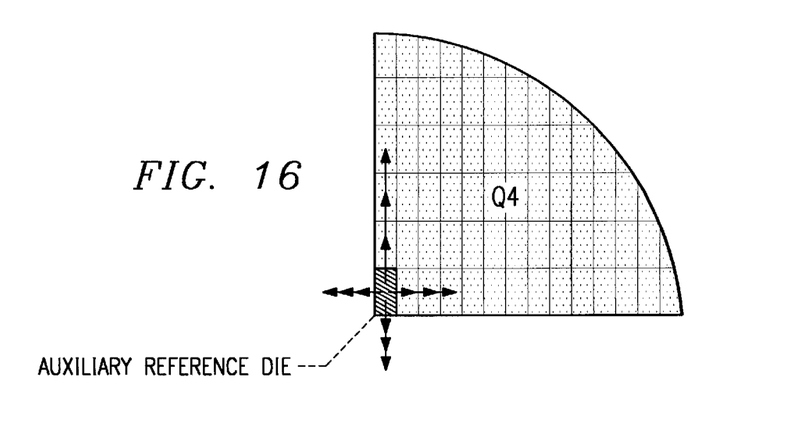
FIG. 16 illustrates method of finding quadrant 4 in quarter wafer processing.

For fourth quadrant of wafer (Q4) the following are true:
a. From auxiliary reference die position, if wafer table is moved in four directions (left, right, up, down) for a certain minimum number of times, all moves in the left & down direction of auxiliary reference die should not see any die. See step 8d and FIG. 16.

Step 9: It computes auxiliary reference die coordinates for the particular partial (quadrant or halo wafer as follows: Locator die coordinate is ($x1$, $y1$) known from step 5.

Figure 17:
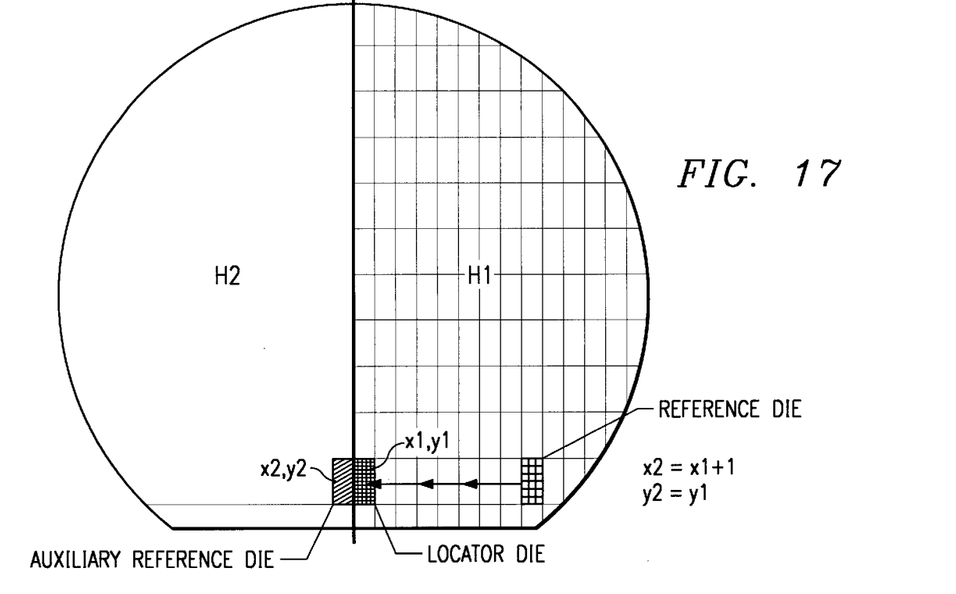
FIG. 17 illustrates computation of auxiliary reference die in half wafer processing.

For half wafer (H2):
Auxiliary reference die coordinate ($x2$, $y2$) is
$x2=x1+1$
$y2=y1$
See FIG. 17.

Figure 18:
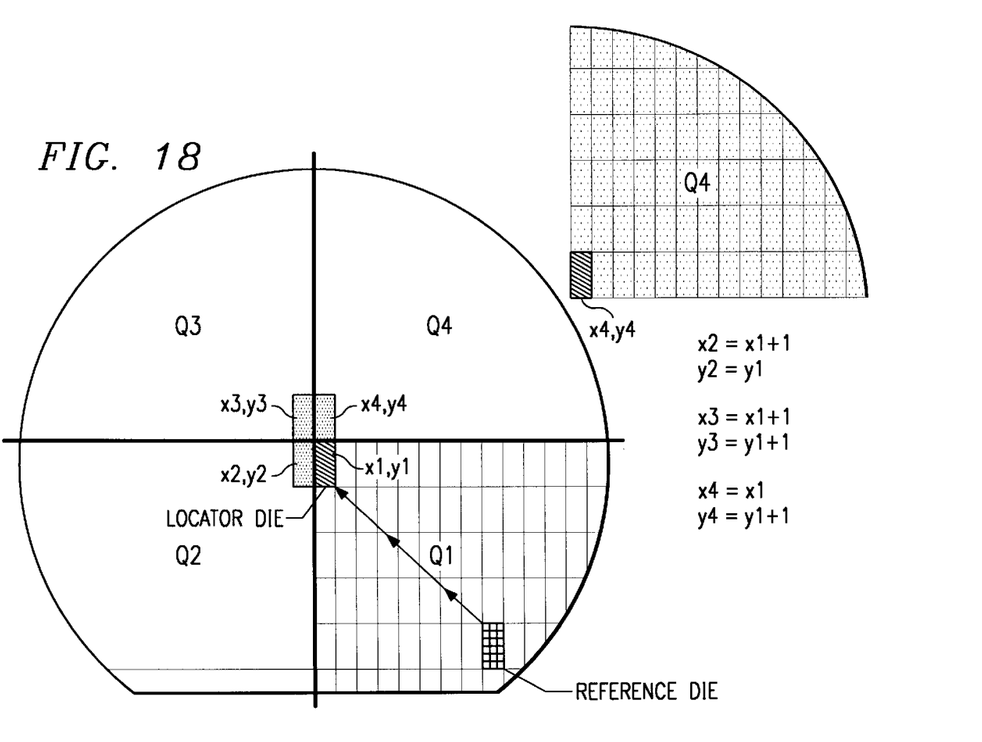
FIG. 18 illustrates computation of auxiliary reference dies in quarter wafer processing.

For second quadrant wafer (Q2):
Auxiliary reference die coordinate ($x2$, $y2$) is
$x2=x1+1$
$y2=y1$
See FIG. 18.

For third quadrant wafer (Q3):
Auxiliary reference die coordinate ($x3$, $y3$) is
$x3=x1+1$
$y3=y1+1$
See FIG. 18.

For fourth quadrant wafer (Q4):
Auxiliary reference die coordinate ($x4$, $y4$) is
$x4=x1$
$y4=y1+1$
See FIG. 18.

Step 10: Using locator die and auxiliary die coordinate information remove other quadrant or half dies from the map.

Figure 19:
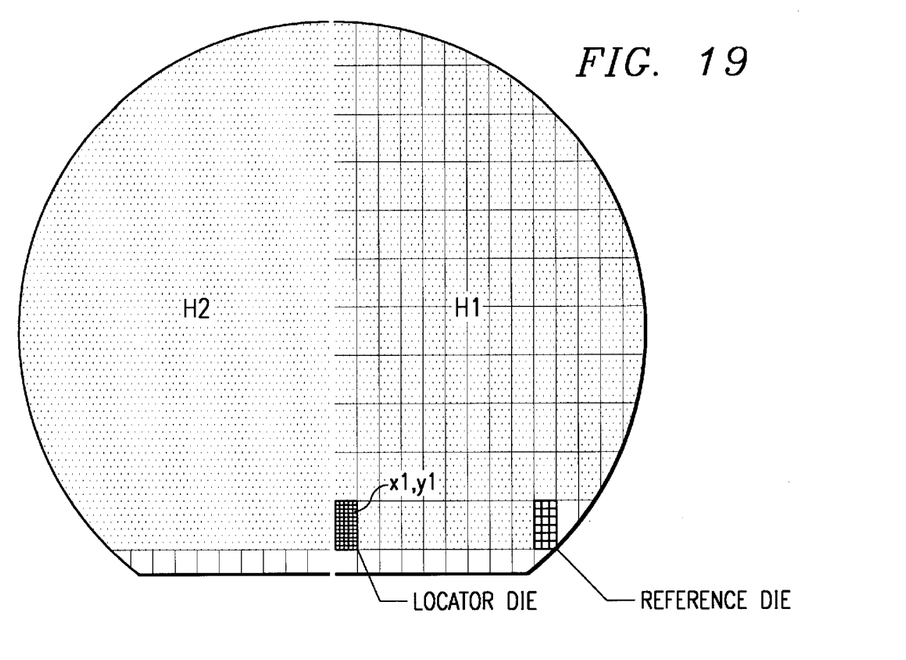
FIG. 19 illustrates removal of second half die coordinates from map in half wafer processing.

First half wafer (H1):
Avoid all moves to dies in second half (H2) of wafer as follows:
a. Locator die coordinate ($x1$, $y1$) is known.
b. Remove all dies in the map which has the x coordinate greater than $x1$. See FIG. 19.

Figure 20:
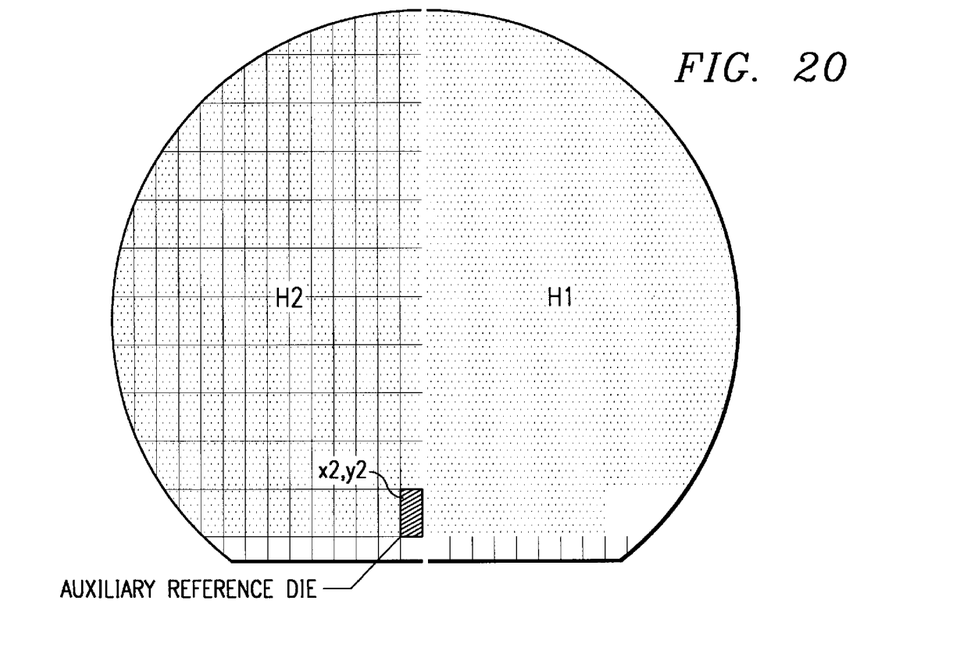
FIG. 20 illustrate removal of first half die coordinates from map in half wafer processing.

Second half wafer (H2):
Avoid all moves to dies in first half (H1) of wafer as follows:
a. Auxiliary reference die coordinate ($x2$, $y2$) is known.
b. Remove all dies in the map which has the x coordinate less than $x2$.
See FIG. 20.

Figure 21:
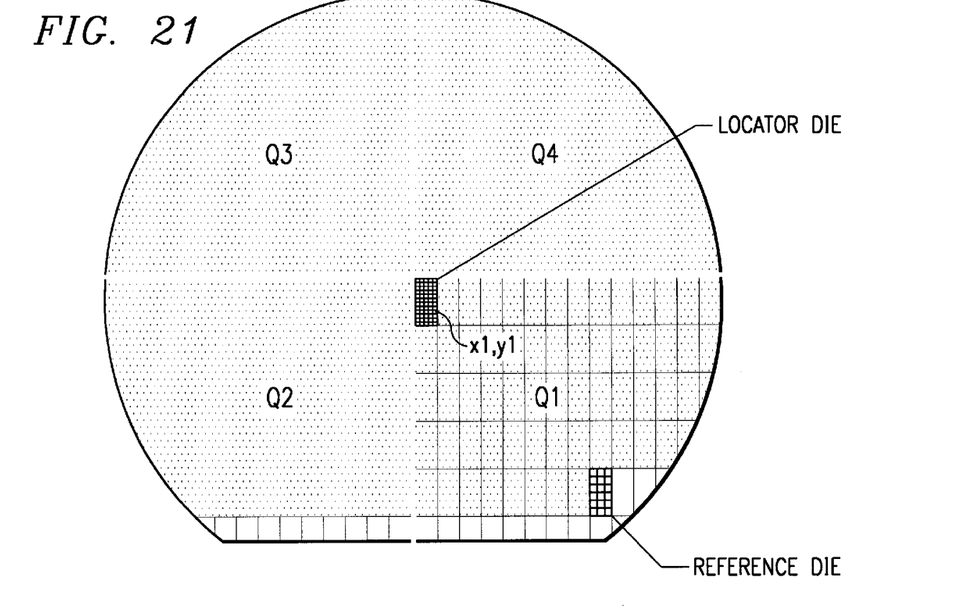
FIG. 21 illustrates removal of second, third and fourth quadrant die coordinates from map during quarter wafer processing.

First quadrant wafer (Q1):
Avoid all moves to dies in second, third & forth quadrant of wafer as follows:
a. Locator die coordinate ($x1$, $y1$) is known.
b. Remove all dies in the map which has the x coordinate greater than $x1$ and the y coordinates greater than $y1$. See FIG. 21.

Figure 22:
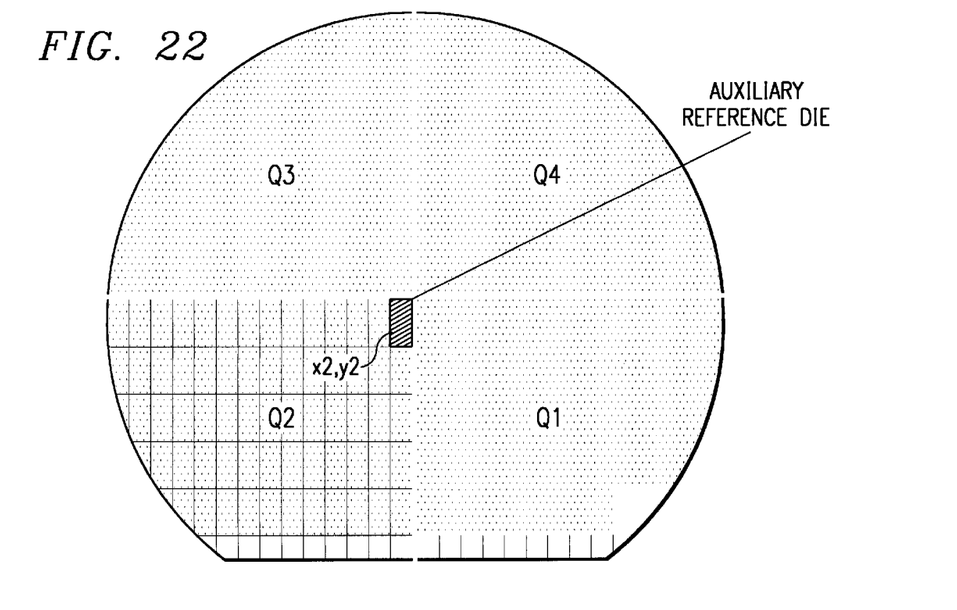
FIG. 22 illustrates removal of first, third, and fourth quadrant die coordinates from map in quarter wafer processing.

Second quadrant wafer (Q2):
Avoid all moves to dies in first, third & fourth quadrant of wafer as follows:
a. Auxiliary reference die coordinate ($x2$, $y2$) is known.
b. Remove all dies in the map which has the x coordinate less than $x2$ and the y coordinates greater than $y2$. See FIG. 22.

Figure 23:
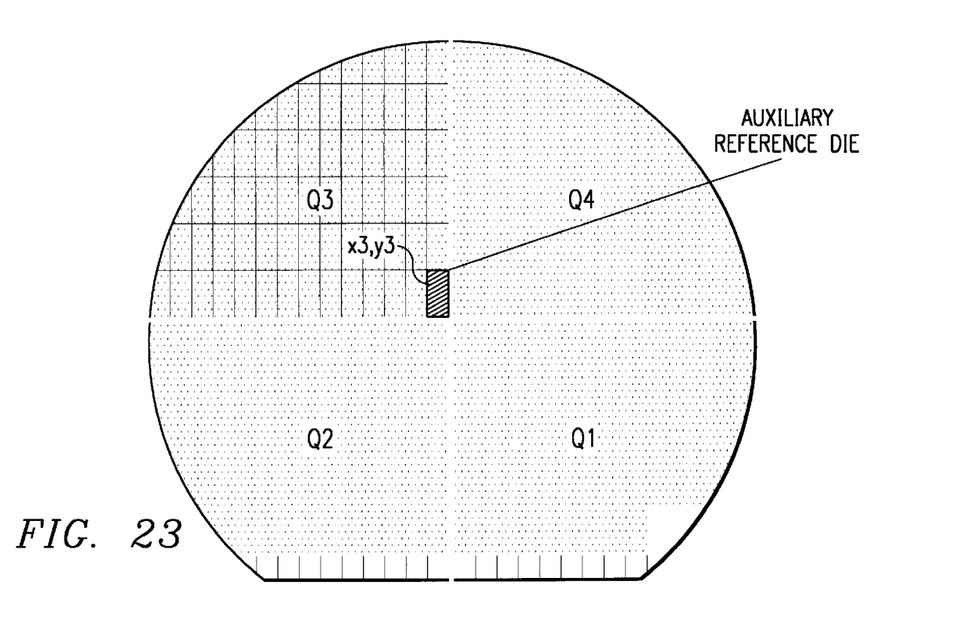
FIG. 23 illustrates removal of first, second, and fourth quadrant die coordinates from map in quarter wafer processing.

Third quadrant wafer (Q3):
Avoid all moves to dies in first, second & forth quadrant of wafer as follows:
a. Auxiliary reference die coordinate ($x3$, $y3$) is known.
b. Remove all dies in the map which has the x coordinate less than $x3$ and the y coordinates less than $y3$. See FIG. 23.

Figure 24:
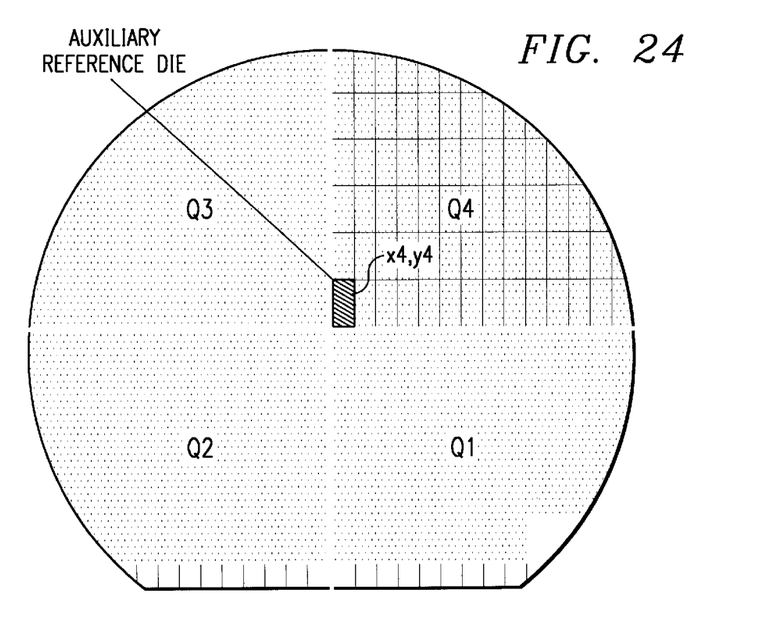
FIG. 24 illustrates removal of first, second, and third quadrant die coordinates from map in quarter wafer processing.

Fourth quadrant wafer (Q4):
Avoid all moves to dies in first, second & third quadrant of wafer as follows:
a. Auxiliary reference die coordinates ($x4$, $y4$) is known.
b. Remove all dies in the map which has the x coordinate greater than $x4$ and the y coordinates less than $y4$. See FIG. 24.

Figure 25:
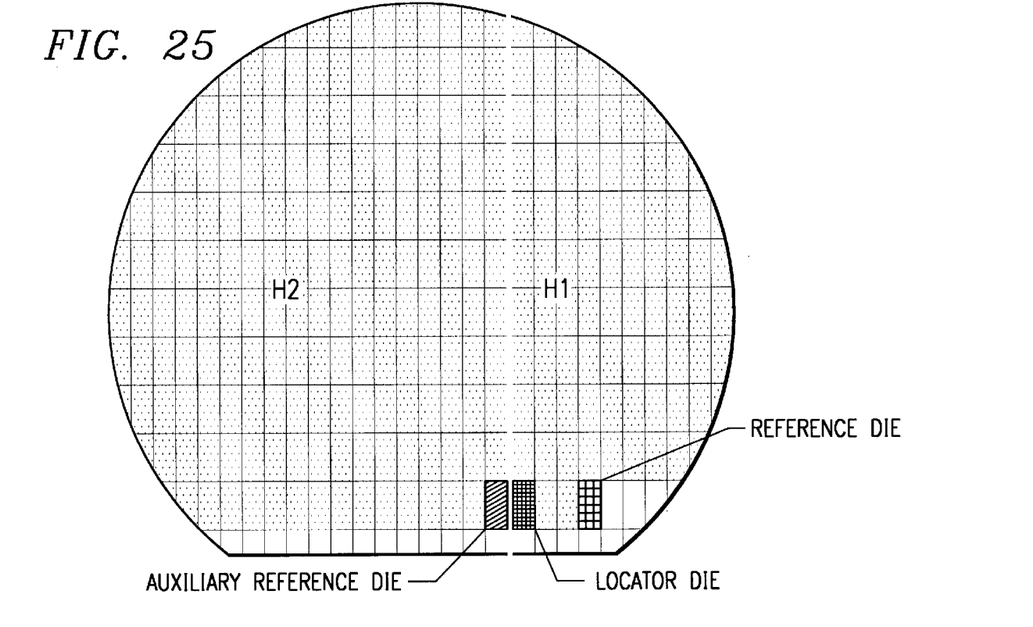
FIG. 25 illustrates reference die, auxiliary reference die, and locator die for half wafer processing for a different wafer cut.
Figure 26:
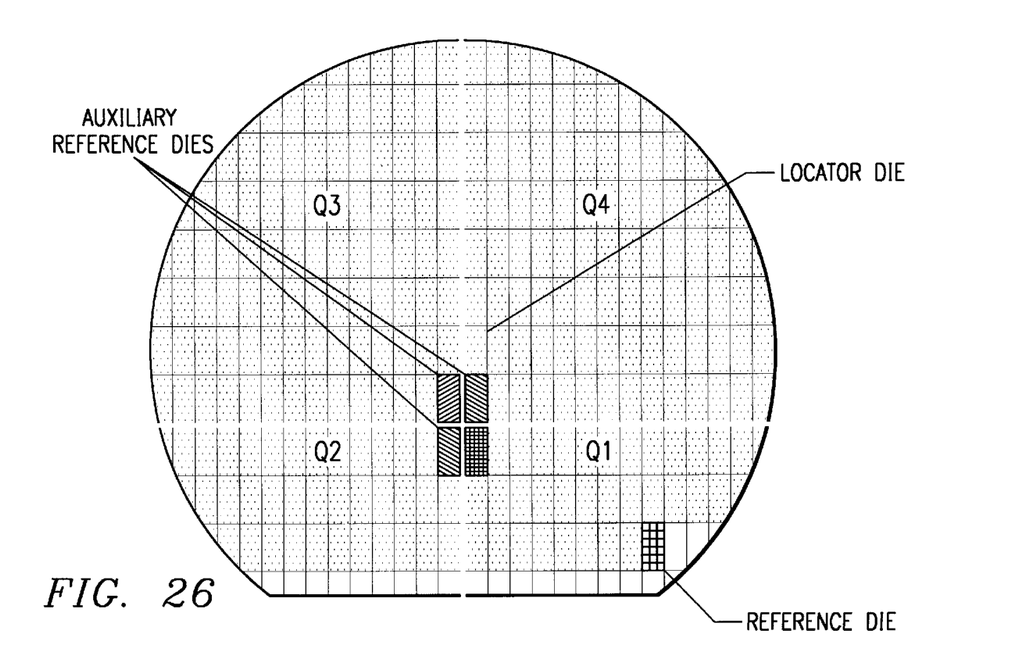
FIG. 26 illustrates reference die, auxiliary reference dies and locator die for quarter wafer processing for a different wafer cut.

The locator die can be any die in the wafer, even the reference die and depends on the cut of the wafer. Any die in the wafer can be the auxiliary reference die except the reference die and it may change to different positions depending on the cut of the wafer. The process creates an auxiliary reference die in case the partial wafer dies not have a reference die and the auxiliary reference die acts as the reference die for the partial wafer map operation. FIGS. 25 and 26 shows the locator die and auxiliary reference die positions for different half wafer and quarter wafer cuts.

Although the present invention and its advantages have been described in detail, it should be understood that various changes, substitutions and alterations can be made herein without departing from the spirit and scope of the invention as defined by the appended claims.

What is claimed is:

1. A method for partial wafer processing comprising the steps of:

identifying a reference die;

determining a locator die coordinate at an edge or corner of a partial wafer from said reference die;

storing said locator die coordinate in a wafer map; and mounting dies as recorded on said wafer map using said locator die coordinate or said reference die as a reference; said mounting step including the steps of determining which portions of said wafer said partial wafer belongs to and removing the other portions from the wafer map.

2. The method of claim 1 wherein said mounting step includes computing an auxiliary reference die coordinate from said locator die coordinate and using said auxiliary reference die as a reference for mounting dies.

3. The method of claim 1 or 2 wherein said mounting step includes determining which half or quadrants said partial wafer belongs to and removing the other half or quadrants from the wafer map.

4. A method for partial wafer processing comprising the steps of:

searching for a reference die and if said reference die is identified determine and store a locator die coordinate on a wafer map at an edge of said partial wafer and generate one or more auxiliary reference die coordinates on said wafer map for one or more other partial wafers adjacent to the partial wafer including said reference die;

determining which half or section said partial wafer belongs to and removing the other half or partial sections from said wafer map; and mounting dies as remain on said wafer map using said reference die or auxiliary reference die coordinates as a reference.

5. A method of partial wafer processing comprising the steps of:

providing a reference die in first half and/or first quadrant of wafer;

creating locator die in the first half and/or first quadrant of said wafer;

creating an auxiliary reference die in second half and/or second, third, and fourth quadrants of said wafer;

loading a wafer map of the whole wafer;

determining if the partial wafer contains the reference die and if so move a table on which the partial wafer is located to the locator die;

uploading locator die coordinates to a wafermap host;

if the partial wafer is in the first half or first quadrant removing the other half or quadrants from the wafer map;

if the partial wafer is not in first half or first quadrant positioning wafer table to auxiliary reference die;

determining which quadrant or which half the partial wafer belongs to;

computing auxiliary reference die coordinates and removing other quadrants or half dies from the wafer map using locator die and auxiliary die coordinates information; and mounting dies on a lead frame omitting removed dies from said wafer map.

* * * * *